US011557913B2

(12) United States Patent
Regazzi et al.

(10) Patent No.: US 11,557,913 B2
(45) Date of Patent: Jan. 17, 2023

(54) THREE-PHASE SYNCHRONOUS RECTIFIER FOR A BATTERY CHARGER ON BOARD A VEHICLE

(71) Applicant: DUCATI ENERGIA S.P.A., Bologna (IT)

(72) Inventors: Gianni Regazzi, Bologna (IT); Pierluigi Calabri, Bologna (IT)

(73) Assignee: Ducati Energia S.p.a., Bologna (IT)

( * ) Notice: Subject to any disclaimer, the term of this patent is extended or adjusted under 35 U.S.C. 154(b) by 110 days.

(21) Appl. No.: 16/979,294

(22) PCT Filed: Mar. 7, 2019

(86) PCT No.: PCT/IB2019/051853
§ 371 (c)(1),
(2) Date: Sep. 9, 2020

(87) PCT Pub. No.: WO2019/171320
PCT Pub. Date: Sep. 12, 2019

(65) Prior Publication Data
US 2021/0057931 A1 Feb. 25, 2021

(30) Foreign Application Priority Data
Mar. 9, 2018 (IT) .................. 102018000003415

(51) Int. Cl.
*H02J 7/00* (2006.01)
*H02J 7/24* (2006.01)
(Continued)

(52) U.S. Cl.
CPC .............. *H02J 7/24* (2013.01); *G01R 15/202* (2013.01); *G01R 19/175* (2013.01);
(Continued)

(58) Field of Classification Search
CPC ........................................................ H02J 7/24
(Continued)

(56) References Cited

U.S. PATENT DOCUMENTS 4,020,294 A * 4/1977 Kitajewski ............. G01R 19/15
379/382
8,159,179 B2 4/2012 Suzuki et al.
(Continued)

FOREIGN PATENT DOCUMENTS

EP    1601078 B1    12/2007

*Primary Examiner* — Yalkew Fantu
(74) *Attorney, Agent, or Firm* — David B. Tingey; Bryant J. Keller; Kirton McConkie

(57) ABSTRACT

The three-phase synchronous rectifier for battery charger on board vehicle comprises: three rectification units provided with respective inputs connected to respective phases of a permanent magnet generator and with respective outputs connected to a battery of a vehicle; wherein the rectification units are configured to receive at input respective phase currents of the generator and to supply at output rectified currents; and wherein each of the rectification units comprises a current sensor connected to a respective phase of the generator and a respective output circuit connected to the battery and operatively connected to said current sensor; the current sensor being configured to receive at input a respective phase current and the output circuit being configured to be piloted by means of the current sensor to generate the rectified currents; wherein the current sensor comprises at least one toroidal element made of a magnetic material crossed by a lead which conveys the phase current and at least one Hall effect sensor connected to the toroidal element and to the output circuit.

15 Claims, 7 Drawing Sheets

(51) Int. Cl.
*G01R 15/20* (2006.01)
*G01R 19/175* (2006.01)
*H02M 1/08* (2006.01)
*H02M 7/219* (2006.01)
*H02M 1/00* (2006.01)

(52) U.S. Cl.
CPC .......... *H02J 7/0047* (2013.01); *H02M 1/083* (2013.01); *H02M 7/219* (2013.01); *H02J 2207/20* (2020.01); *H02M 1/0009* (2021.05); *H02M 7/2195* (2021.05)

(58) Field of Classification Search
USPC ....................................................... 320/137
See application file for complete search history.

(56) References Cited

U.S. PATENT DOCUMENTS

| | | | |
|---|---|---|---|
| 8,159,180 B2 * | 4/2012 | Suzuki | H02J 7/1492 |
| | | | 320/148 |
| 2005/0226298 A1 | 10/2005 | Asia | |
| 2016/0049857 A1 * | 2/2016 | Zhang | H02M 7/217 |
| | | | 363/127 |
| 2016/0193934 A1 * | 7/2016 | Marathe | B60L 53/305 |
| | | | 320/137 |

* cited by examiner

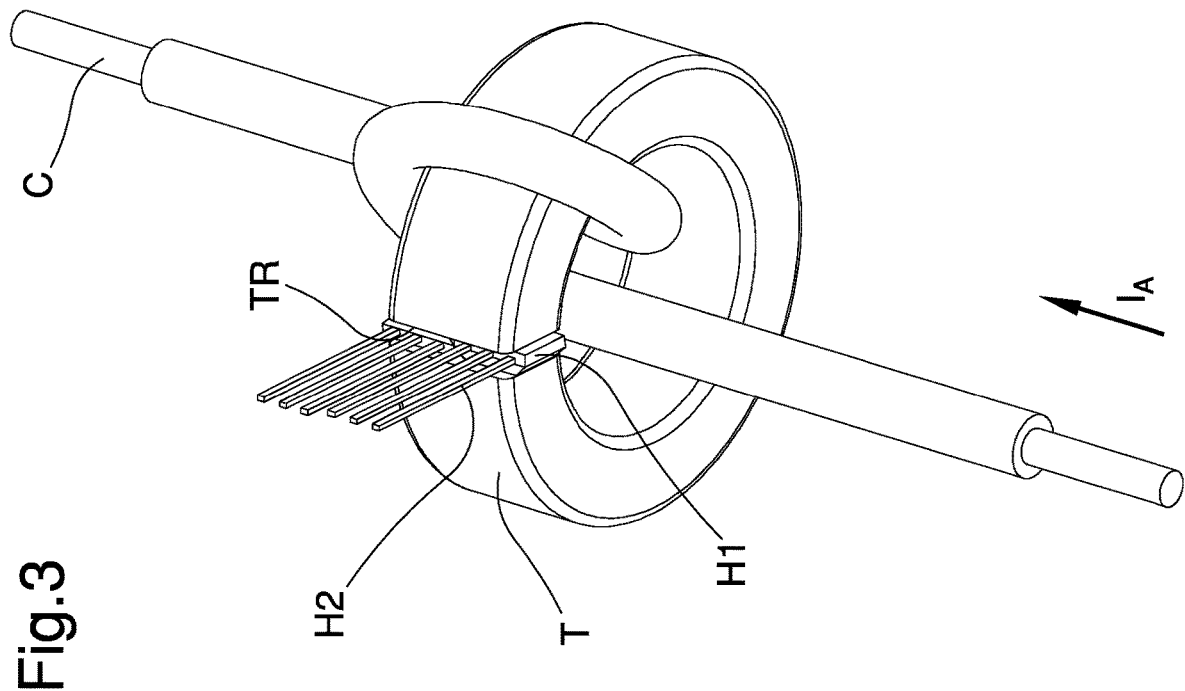
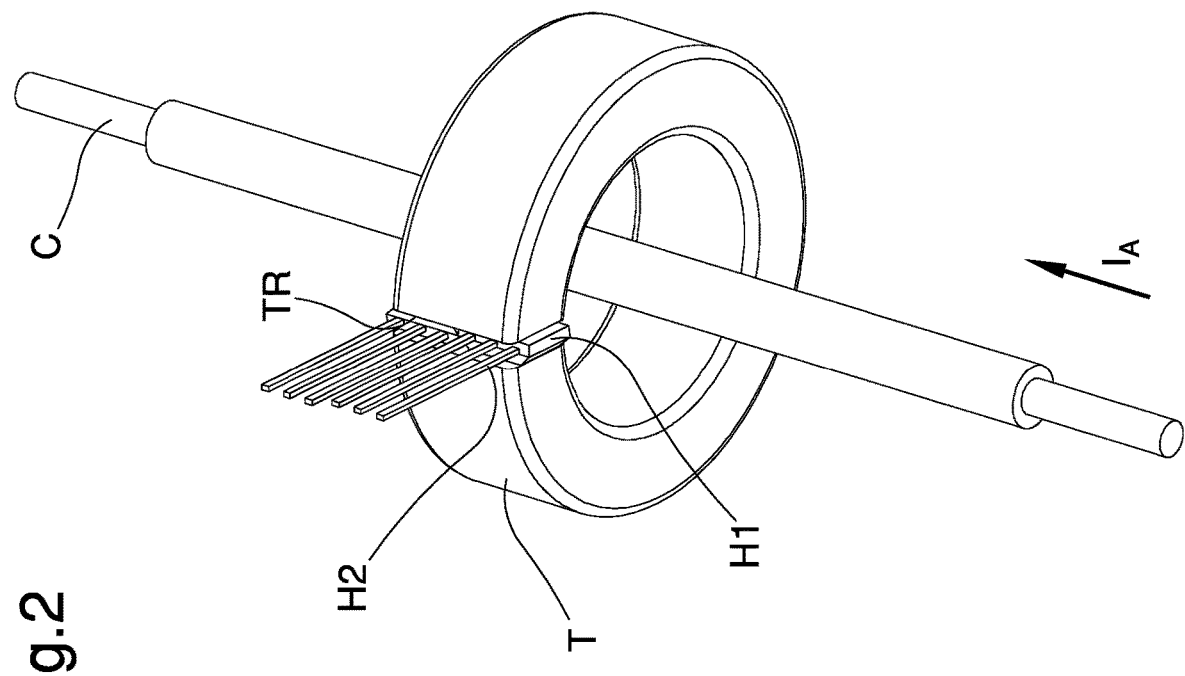

THREE-PHASE SYNCHRONOUS RECTIFIER FOR A BATTERY CHARGER ON BOARD A VEHICLE

TECHNICAL FIELD

The present invention relates to a three-phase synchronous rectifier for battery charger on board vehicle.

BACKGROUND ART

It is well known that the increase in the demand for electricity on board vehicles has led to the development of electric generators capable of generating a current of more than 120 A with a voltage of 14V.

In the case of particular motor applications such as e.g. ATVs (All-Terrain Vehicles) or snowmobiles, conventional automotive-type generators cannot be used due to space constraints. For such applications, rare-earth permanent magnet generators with high power and good efficiency, together with reduced overall dimensions are preferred.

It is also known that, when current levels exceed 40 A, the normal three-phase regulators of the shunt type or series with controlled rectifier bridge consisting of diodes and SCRs have a power dissipation that is difficult to manage in aluminum finned enclosures with reduced overall dimensions.

In this regard, with particular reference to document EP 1 601 078 B 1, the use is known of shunt regulators with the power part consisting of three Power MOS transistors and three Schottky diodes, able to reduce the dissipated power to about 30% of the value referred to the diode and SCR solution.

Furthermore, the documents U.S. Pat. No. 8,159,179 B2 and U.S. Pat. No. 8,159,180 B2 describe the implementation of algorithms for controlling the angle of conduction of Power MOS transistors, used to optimize generator performance in relation to the rotation speed of the endothermic motor and electrical loads.

These known solutions are however subject to improvement, aimed in particular at the creation of a Power MOS three-phase synchronous rectifier with the function of regulating the voltage for charging a battery of a vehicle which is particularly simple and economical and which, at the same time, can be combined with three-phase generators with permanent magnets for high currents, including over 120 A, for vehicles with electrical systems powered by 12V.

In particular, in recent years, improvements in the technology of Power MOS transistors have made possible the development of components which, voltage being equal, have values of conduction resistance (RDS(on)) that are considerably reduced ($\leq 1$ m$\Omega$ with a voltage Vds$\geq$40V).

Such devices are particularly suitable for the realization of three-phase shunt regulators to be combined with permanent magnet generators which, in addition to the current and voltage values mentioned above, have electrical frequencies even higher than 1.5 kHz.

Moreover, in the panorama of the electronic components dedicated to synchronous rectification, integrated circuits exist which are able to detect the voltage drop between the Drain terminal and the Source terminal of the Power MOS transistor and to synchronize the Gate drive based on the measured value of the aforementioned voltage drop.

However, in the case of Power MOS transistor with RDS(on) lower than 1 m$\Omega$, it becomes particularly difficult to measure the aforementioned voltage drop to detect the zero-crossing of the current flowing in the transistor, as this would mean detecting voltage values of around only a few mV.

In addition to this, in the case of multipole permanent magnet generators with high currents combined with endothermic motors with speeds that can exceed 12,000 RPM, the response times of the current synchronization system in the Power MOS transistors with the driving of the Power MOS themselves are of particular importance.

DESCRIPTION OF THE INVENTION

The main aim of the present invention is to provide a three-phase synchronous rectifier for battery chargers on-board vehicle which allows accurately detecting the zero-crossing of the current of the generator phases while maintaining adequate response times of the synchronization system.

Another object of the present invention is to provide a three-phase synchronous rectifier for battery chargers on-board vehicle that ensures a low voltage drop between the generator and the battery.

Another object of the present invention is to provide a three-phase synchronous rectifier for battery chargers on-board vehicle that allows overcoming the aforementioned drawbacks of the prior art in a simple, rational, easy, effective to use and low-cost solution.

The aforementioned objects are achieved by the present three-phase synchronous rectifier for battery chargers on-board vehicle described in claim 1.

BRIEF DESCRIPTION OF THE DRAWINGS

Other characteristics and advantages of the present invention will be more evident from the description of a preferred, but not exclusive, embodiment of a three-phase synchronous rectifier for battery chargers on-board vehicle, illustrated by way of an indicative, but non-limiting example, in the attached tables of drawings in which:

FIGS. 2 and 3 illustrate different possible implementations of a current sensor that can be used in the first embodiment of the three-phase synchronous rectifier according to the invention;

EMBODIMENTS OF THE INVENTION

With particular reference to these illustrations, reference RT globally indicates a three-phase synchronous rectifier, particularly usable in combination with a permanent magnet generator for the charge of the battery of a motor vehicle.

Figure 1:
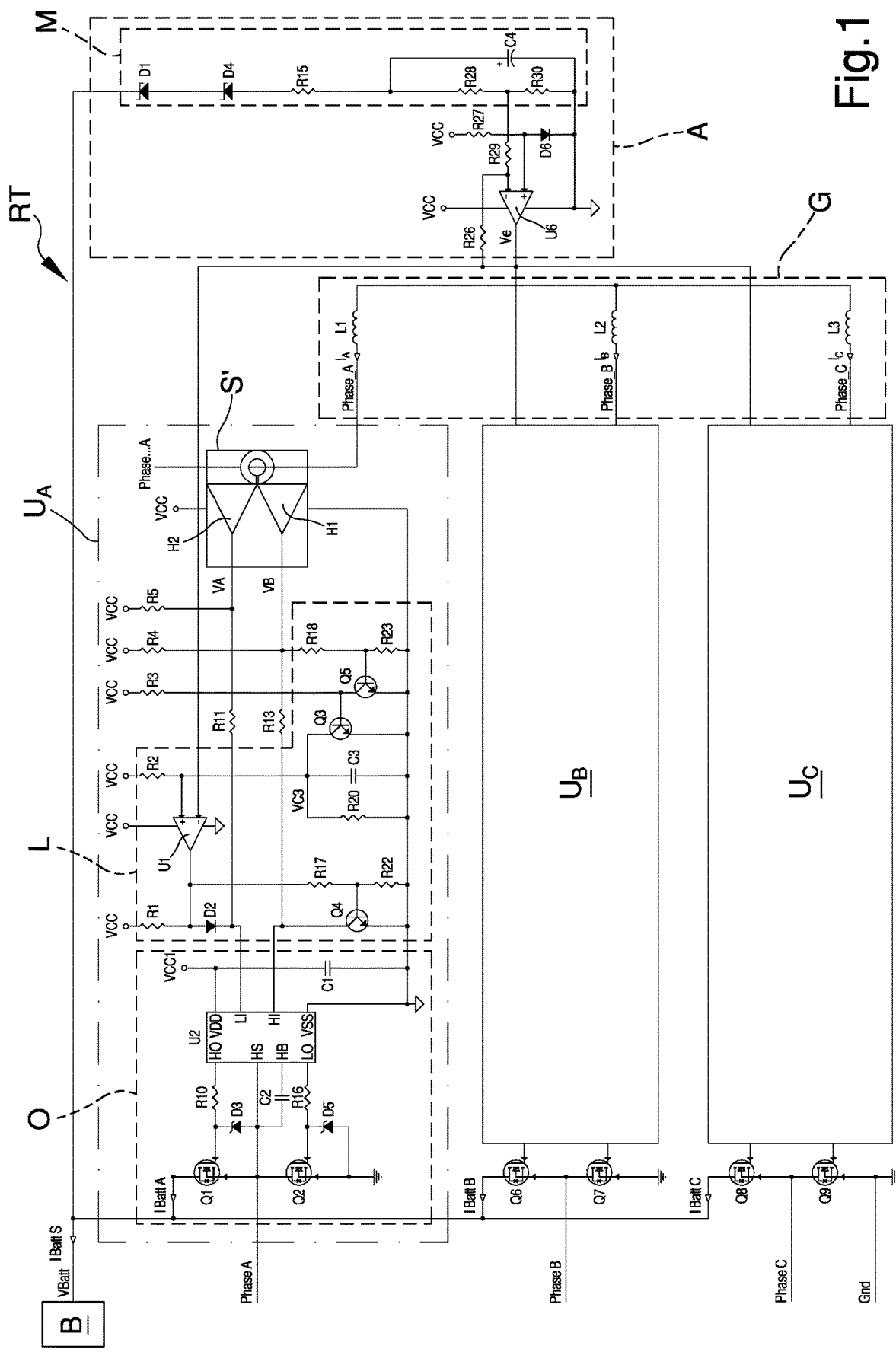
FIG. 1 is a general electrical diagram illustrating a first possible embodiment of the three-phase synchronous rectifier according to the invention.
Figure 7:
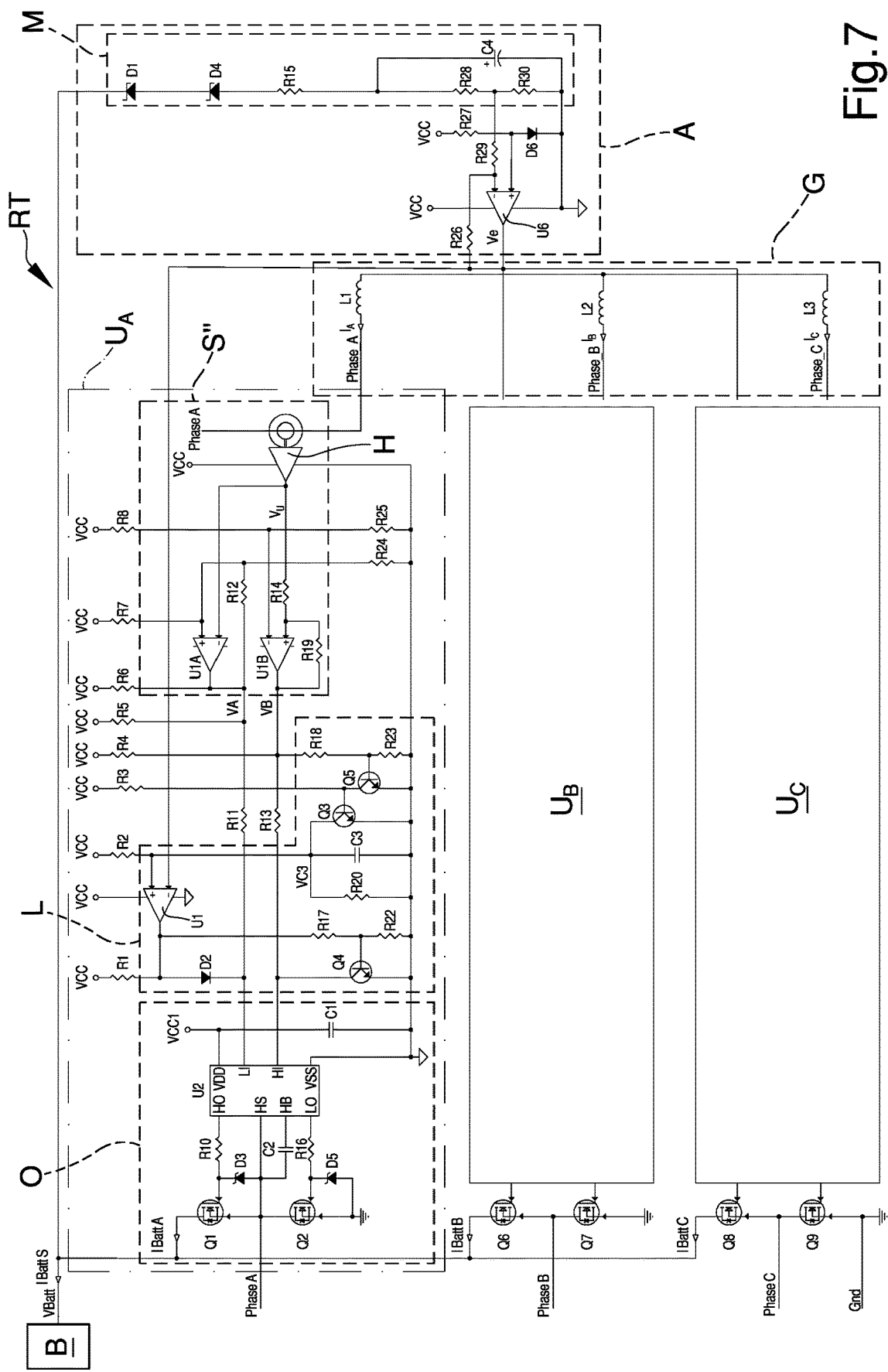
FIG. 7 is a general electrical diagram illustrating a second possible embodiment of the three-phase synchronous rectifier according to the invention.

In particular, as schematized in FIGS. 1 and 7, the three-phase synchronous rectifier RT comprises three rectification units $U_A$, $U_B$, $U_C$ provided with respective inputs connected to respective phases of a permanent magnet generator G and with respective outputs connected to a battery B of a vehicle.

The rectification units $U_A$, $U_B$, $U_C$ are configured to receive at input respective phase currents $I_A$, $I_B$, $I_C$ of the generator G and to supply at output rectified currents $I_{BATT}A$, $I_{BATT}B$, $I_{BATT}C$ to be supplied to the battery B of the vehicle.

Each of the rectification units $U_A$, $U_B$, $U_C$ comprises a current sensor S', S" connected to a respective phase of the generator G and a respective output circuit O connected to the battery B and operatively connected to the current sensor S', S". The current sensor S', S" is configured to receive at input a respective phase current $I_A$, $I_B$, $I_C$, while the output circuit O is configured to be piloted by means of the current sensor S', S" to generate the rectified currents $I_{BATT}A$, $I_{BATT}B$, $I_{BATT}C$.

Advantageously, a decisive aspect of the three-phase synchronous rectifier RT according to the invention consists in the fact that, on each rectification unit $U_A$, $U_B$, $U_C$, the current sensor S', S" comprises at least one toroidal element T made of a magnetic material crossed by a lead C which conveys the phase current $I_A$, $I_B$, $I_C$ and at least one Hall effect sensor H1, H2, H connected to the toroidal element T and to the output circuit O.

In particular, the three-phase synchronous rectifier RT according to the invention can be implemented according to two possible and preferred embodiments: a first embodiment wherein the current sensor S' of each of the three rectification units $U_A$, $U_B$, $U_C$ comprises two digital unipolar Hall sensors H1 and H2 (FIGS. 1-6); a second embodiment wherein the current sensor S" of each of the three rectification units $U_A$, $U_B$, $U_C$ comprises one linear Hall sensor H (FIGS. 7-10).

The first possible embodiment of the three-phase synchronous rectifier RT according to the invention is described below, wherein the current sensor S' comprises two unipolar Hall effect magnetic sensors: a first unipolar Hall sensor H1 and a second unipolar Hall sensor H2. This first embodiment is illustrated in FIGS. 1-6.

With reference to this first embodiment, the first and second unipolar Hall sensors H1, H2 are configured to be operate in the presence of respective and predefined levels of magnetic flux on the toroidal element (T).

As shown in the circuit diagram in FIG. 1, the three-phase synchronous rectifier RT is connected to a three-phase permanent magnet generator G.

In particular, FIG. 1 relates to a three-phase permanent magnet generator G wherein the three phase currents $I_A$, $I_B$, $I_C$ like the three currents supplied to the battery $I_{BATT}A$, $I_{BATT}B$, $I_{BATT}C$, have the same value but with phase displacement between one another by 120 degrees. The three currents $I_{BATT}A$, $I_{BATT}B$, $I_{BATT}C$ supplied to the battery add up to a single total current $I_{BATT}S$ supplied to the battery.

It is pointed out that the following description of the operation of the three-phase synchronous rectifier RT with voltage regulation function makes reference to only one phase of the system, the operation of the other two phases being completely the same. Consequently, in the description and in the illustrations, only the first rectification unit $U_A$, relating to the phase A, is detailed. The other two rectification units $U_B$ and $U_C$, relating to the phases B and C, are made and operate in a manner completely identical to the first rectification unit $U_A$.

As shown in FIGS. 2 and 3, the toroidal element T is provided with an air gap TR and the two unipolar Hall sensors H1, H2 are arranged inside the air gap TR side by side and rotated by 180 degrees the one with respect to the other.

Figure 4:
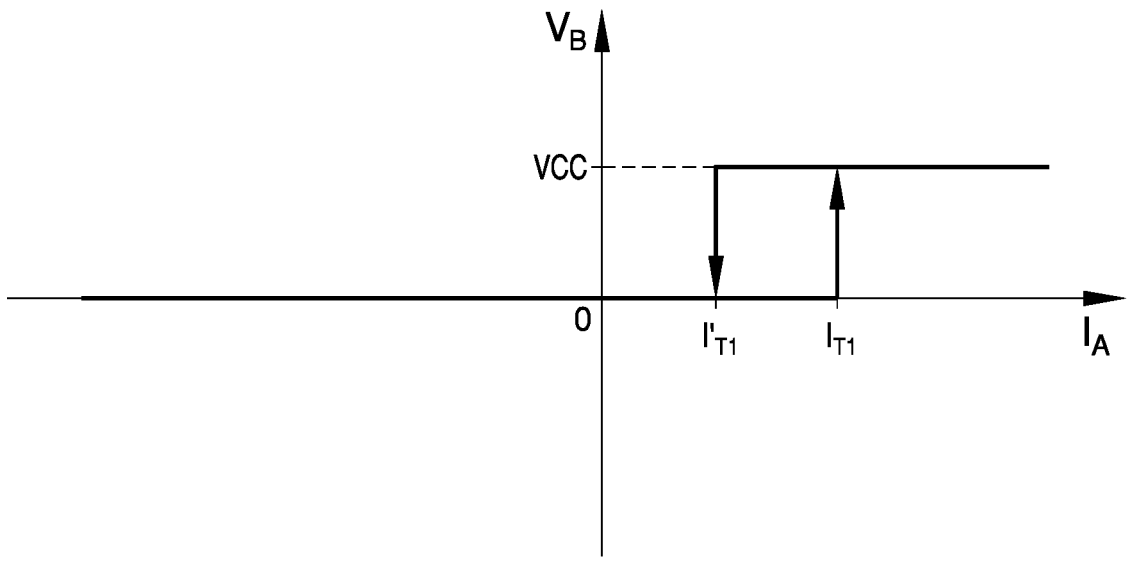
FIG. 4 is a graph illustrating the pattern of the output signal of a first Hall sensor according to the first embodiment of the three-phase synchronous rectifier.

In particular, as shown in FIG. 4, the first unipolar Hall sensor H1 is configured to switch the output voltage $V_B$ from a low voltage value (0V) to a high voltage value ($V_{CC}$) at a first predefined threshold value $I_{T1}$, when the phase current $I_A$ (or $I_B$ and $I_C$ with reference to the other phases) is positive and increasing.

When, on the contrary, the phase current $I_A$ is positive and decreasing, the first unipolar Hall sensor H1 is configured to switch the output voltage $V_B$ from the high voltage value ($V_{CC}$) to the low voltage value (0V) at a second predefined threshold value $I'_{T1}$.

Therefore, the first unipolar Hall sensor H1 is configured to create a hysteresis at the predefined switch threshold values $I_{T1}$, $I'_{T1}$.

Figure 5:
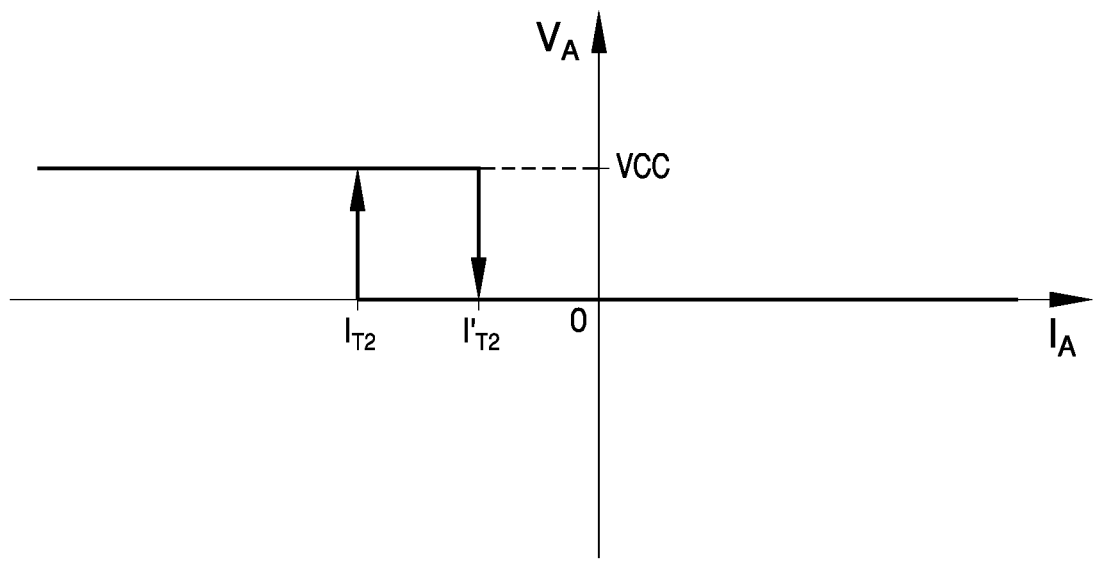
FIG. 5 is a graph illustrating the pattern of the output signal of a second Hall sensor according to the first embodiment of the three-phase synchronous rectifier.

FIG. 5 shows the pattern of the output signal $V_A$ of the second unipolar Hall sensor H2 which, being flanked and rotated by 180° with respect to the first unipolar Hall sensor H1, possesses a similar behavior even if referred to the negative values of the phase current $I_A$. The threshold values of the currents for the switch of the second Hall sensor H2 are $I_{T2}$ and $I'T_2$ respectively.

In particular, the second unipolar Hall sensor H2 is configured to switch the output voltage $V_A$ from a low voltage value (0V) to a high voltage value ($V_{CC}$) at a first predefined threshold value $I_{T2}$, when the phase current $I_A$ (or $I_B$ and $I_C$ with reference to the other phases) is negative and.

When, on the contrary, the phase current $I_A$ is negative and decreasing, the second unipolar Hall sensor H2 is configured to switch the output voltage $V_A$ from the high voltage value ($V_{CC}$) to the low voltage value (0V) at a second predefined threshold value $I'T_2$.

Examples of possible embodiments of the sensor S' are illustrated in FIGS. 2 and 3.

In particular, as illustrated in the example of FIG. 3, the sensor S' can comprise a plurality of windings of the lead C around at least one portion of the toroidal element T.

In particular, in case of wanting to reduce in absolute value the current values of the thresholds $I_{T1}$, $I'_{T1}$, $I_{T2}$, $I'_{T2}$, it is possible to pass twice or more times, instead of only one as shown in FIG. 2, the lead that carries the phase current $I_A$ inside the magnetic toroidal element T. This way, the current values of the thresholds $I_{T1}$, $I'_{T1}$, $I_{T2}$, $I'_{T2}$ will be divided by the number of spirals of the lead C wound on the magnetic toroidal element T.

According to a preferred embodiment, shown in FIG. 1, the unipolar Hall sensors H1 and H2 are of the "open collector" type. Alternative embodiments cannot however be ruled out wherein, for example, the sensors are of the "push-pull" type.

Furthermore, the use of unipolar Hall sensors cannot be ruled out with the output which is inverted with respect to that described in FIGS. 1, 4 and 5. In this case, to return to the operating conditions described above it is possible to invert the output signals of the magnetic sensors through the use of a transistor or of a signal inverter.

Furthermore, the possibility of using double unipolar Hall sensors cannot be ruled out, so as to replace the two unipolar Hall sensors H1 and H2 described above with a single sensor.

As shown in FIG. 1 (and in FIG. 7 with reference to the second embodiment), in each of the three rectification units $U_A$, $U_B$, $U_C$ the output circuit O comprises at least a first Power MOS transistor Q1 and at least a second Power MOS transistor Q2 operatively connected to the current sensor S' (to the sensor S" with reference to the second embodiment) and adapted to be piloted by means of the current sensor S' (S") to generate the rectified currents $I_{BATT}A$, $I_{BATT}B$, $I_{BATT}C$.

Furthermore, the output circuit O comprises at least one half-bridge driver U2 operatively interposed between the current sensor S' (S") and the first and second Power MOS transistors Q1 and Q2.

In particular, the half-bridge driver U2 is provided with a first input HI connected to the first unipolar Hall sensor H1 and with a second input LI connected to the second unipolar Hall sensor H2.

The unipolar digital Hall sensors H1, H2 are usefully selected with response times short enough according to the electrical frequency of the generator G, so as not to generate excessive delays regarding the synchronization of the switch of the Power MOS transistors Q1 and Q2.

When the endothermic motor starts up and the generator G reaches a speed so that in the stator windings L1, L2 and L3 a voltage is generated which, exceeding that of the battery $V_{Batt}$, directly polarizes the diodes inside the Power MOS transistors Q1 and Q2, we have a current flow through the diodes themselves even if the Power MOS themselves are not piloted, as happens in a conventional three-phase rectifier diode bridge.

The operation of the half-bridge driver U2 and of the first and second Power MOS transistors Q1 and Q2 is as follows.

Assuming the direction of the current which from the generator G flows towards the battery to be positive, when the current of phase $I_A$ which crosses the toroidal element T in ferrite exceeds the threshold value $I_{T1}$, a magnetic flow is generated in agreement with the direction of the current $I_A$ itself which exceeds the magnetic threshold value $I_{T1}$ of the first unipolar Hall sensor H1.

In this case, the output signal $V_B$ of the first unipolar Hall sensor H1 switches to a high logic value. In particular, the output signal $V_B$ of the first unipolar Hall sensor H1 switches to a high logic value through the resistor R4.

The logic value remains high until the current $I_A$ drops below the threshold value $I'_{T1}$.

Such signal $V_B$ is applied, through the resistor R13, at the input HI of the half-bridge driver U2.

The half-bridge driver U2 is configured to pilot the output HO to the high value and, therefore, to positively polarize the gate of the Power MOS transistor Q1 through the resistor R10, thus sending the first transistor Q1 itself in conduction. The Power MOS transistor Q1 will remain in this state as long as the input HI of the half-bridge driver U2 remains at a high logic value.

The purpose of the Zener diodes D3 and D5 is to protect the Gates of the first and of the second Power MOS transistors Q1 and Q2, respectively.

In the same way as described above, when the sign of the current $I_A$ is inverted and becomes lower than the threshold value $I_{T2}$, a magnetic flux is generated in the toroidal element T in ferrite according to the direction of the current $I_A$ itself which exceeds the magnetic threshold value of the second unipolar Hall sensor H2.

The output signal $V_A$ of the second unipolar Hall sensor H2 switches to a high logic value through the resistor R5, and remains high until the current $I_A$ climbs above the threshold value $I'_{T2}$.

In this configuration, the signal $V_A$ is applied, through the resistor R11, to the input LI of the half-bridge driver U2 which pilots the output LO at high value and, therefore, positively polarizes the Gate of the second Power MOS transistor Q2 through the resistor R16, thus sending the second transistor Q2 itself in conduction.

The second Power MOS transistor Q2 will remain in this state as long as the input LI of the half-bridge driver U2 remains at a high logic value.

The half-bridge driver U2, powered by the voltage $V_{CC1}$ with the decoupling capacitor C1 at the typical value of 10 V, which may differ from the $V_{CC}$ value, uses the capacitor C2 as "bootstrap charging" to pilot the gate of Q1 and also avoids the simultaneous conduction of the transistors Q1 and Q2.

Different embodiments cannot however be ruled out wherein, for example, a device is used which integrates inside it three half-bridge drivers in a single container.

Figure 6:
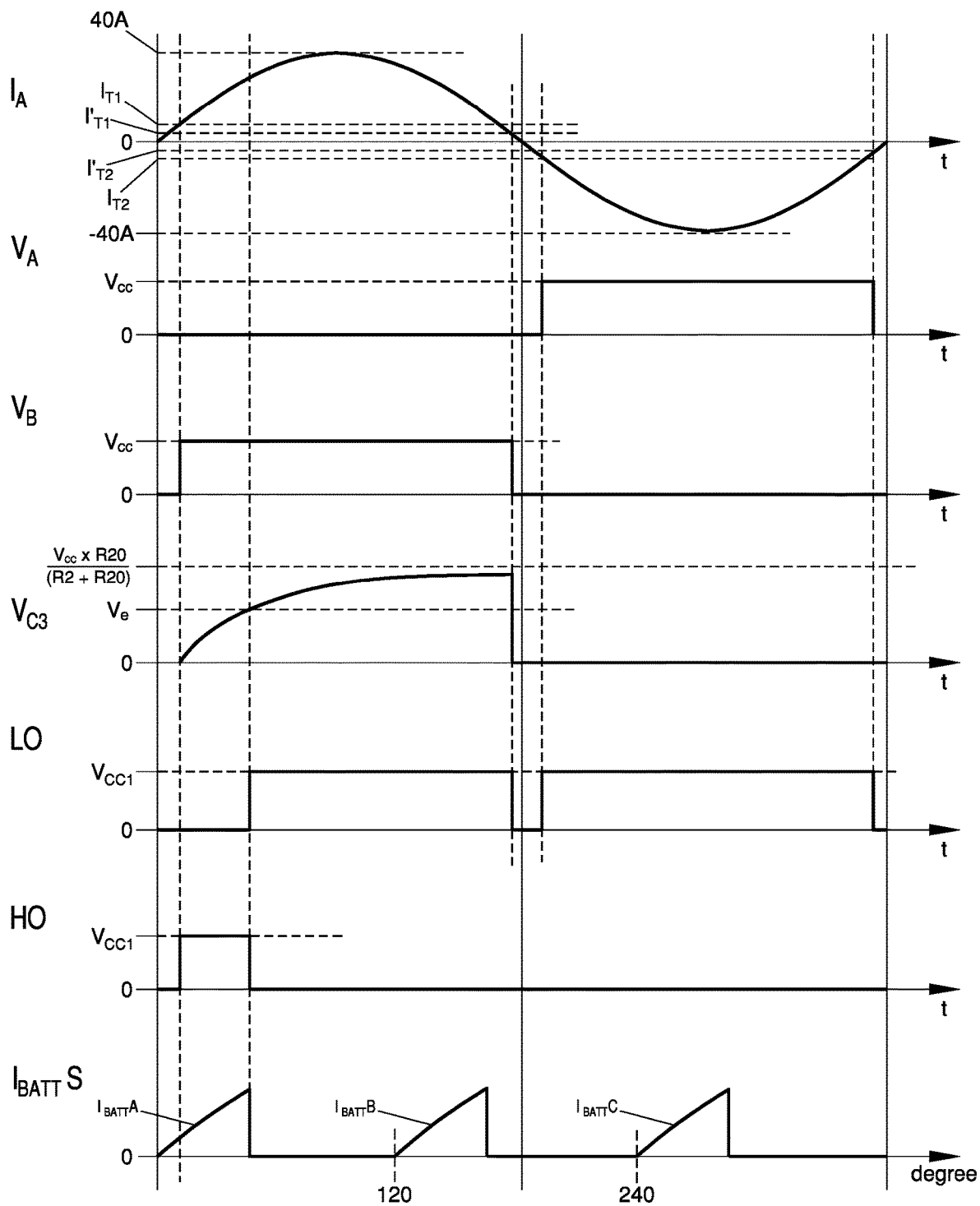
FIG. 6 graphically illustrates the patterns of the signals with reference to the first embodiment of the three-phase synchronous rectifier according to the invention.

FIG. 6 graphically illustrates the operation described above.

It should also be noticed that until the phase current $I_A$ is lower in absolute value than the switching thresholds of the unipolar Hall sensors H1 and H2, the circulation of the current occurs by means of the internal diodes of the Power Mos transistors Q1 and Q2. These diodes have a typical voltage drop of around 0.7V, which is why it is important to limit the aforementioned switch thresholds $I_{T1}$ and $I_{T2}$ to current values of around 3 A, so as to limit dissipation during this transition phase before the Power Mos transistors Q1 and Q2 enter conduction.

What has been described thus far is the operation relating to the synchronous rectification which represents the case in which all the current supplied by the permanent magnet generator G is supplied to the battery and loads of the vehicle.

In the event of the battery voltage $V_{Batt}$ exceeding the desired value, which for lead batteries is normally 14.5V, the current supplied by the generator G to the battery in order to keep the regulating voltage constant must be limited.

Such function is implemented by limiting the angle of conduction of the Power MOS transistor Q1 and at the same time putting in conduction the Power MOS transistor Q2 in the way described below.

The three-phase synchronous rectifier RT advantageously comprises a current limiting circuit A, L configured to limit the current supplied by the generator G to the battery B in the event of the voltage $V_{Batt}$ supplied to the battery B exceeding a predefined desired value.

In particular, the current limiting circuit A, L comprises an error amplifier circuit A configured to measure the voltage supplied to the battery $V_{Batt}$ and to supply a verification voltage signal Ve at output which varies between predefined voltage values acceptable for the correct operation of the battery.

The error amplifier circuit A specifically comprises a measurement circuit M of the voltage $V_{Batt}$ supplied to the battery B.

With reference to the specific preferred embodiments illustrated in the FIGS. 1 and 7, the measurement circuit M for measuring the voltage supplied to the battery $V_{Batt}$ comprises a couple of Zener diodes D1, D4 connected in series the one to the other and to a resistive divider R15, R28, R30.

The battery voltage $V_{Batt}$ is measured by means of the Zener diodes D1 and D4 and by means of the resistive divider made up of the resistors R15, R28, R30.

The resistive divider R15, R28, R30 together with a capacitor C4 furthermore constitutes a low-pass filter to limit the ripple on the battery voltage $V_{Batt}$.

The sum of the voltages of the two Zener diodes D1, D4 is selected between 13.0V and 13.6V in order to limit the current absorption from the battery with the endothermic motor of the generator G off.

In addition, the error amplifier circuit A comprises at least one operational amplifier U6 provided with a non-inverting input connected to a reference voltage and with an inverting input connected to the measurement circuit M.

The operational amplifier U6 is configured to supply the verification voltage signal $V_e$ at output.

In particular, the reference voltage is determined by the voltage drop onto a diode D6 when this is crossed by the current limited by a resistor R27 connected between the voltage $V_{CC}$ and the anode of the diode D6 itself.

Furthermore, the ratio between the resistance values of the resistors R26 and R29 connected between the inverting input and the output and between the inverting input and the measurement circuit M respectively, which is approximately 100, determines the gain of the operational amplifier U6 in the inverting configuration.

Therefore, by appropriately selecting the values of these resistors R26 and R29, the verification voltage signal Ve present at the output of the operational amplifier U6 will vary linearly from a minimum acceptable voltage value to a maximum acceptable voltage value. For example, the minimum acceptable voltage value may be 0V with a battery voltage of 14.4V, while the maximum acceptable voltage value may be $V_{cc}$ with a battery voltage of 14.6V. This excursion of the battery voltage value, which corresponds to the condition of full load and load absent at its ends respectively, is widely acceptable for the applications considered.

In addition, the current limiting circuit A, L comprises, for each rectification unit $U_A$, $U_B$, $U_C$, at least one verification and limitation circuit L operatively connected to the current sensor S', to the error amplifier circuit A and to the output circuit O. The verification and limitation circuit L is configured to pilot the output circuit O, in order to make a phase control of the rectified current $I_{BATT}A$ ($I_{BATT}B$, $I_{BATT}C$) supplied to the battery B when the verification voltage signal Ve varies.

When the output $V_B$ of the first unipolar Hall sensor H1 switches to a high logic value, the transistor Q5 will be piloted in conduction by means of the two resistors R18 and R23. At the same time, the transistor Q3 will be interdicted, because its base is not polarized, the current coming from the resistor R3 being short-circuit proof against earth by the transistor Q5.

Because the transistor Q3 is interdicted, the capacitor C3 can charge itself with negative exponent rule at the asymptotic value resulting from the formula VCC×R20/(R2+R20).

The pattern of the voltage $V_{C3}$ of the capacitor C3 is shown in FIG. 6.

The signal $V_{C3}$ is applied to the non-inverting input of the comparator U1, while to the inverting input is applied the output signal Ve of the operational amplifier U6.

When the value of the signal $V_{C3}$ exceeds the value of the signal Ve, the output of the comparator U1 switches to the high logic value by means of the resistor R1. Such high logic value is applied by means of the diode D2 to the input LI of the half-bridge driver U2 and, by means of the resistive divider made up of the resistors R17 and R22, to the base of the transistor Q4, bringing it in conduction. The conduction of Q4 forces the input HI of the half-bridge driver U2 at a low logic value.

The inputs LI and HI of the half-bridge driver U2 being at high and low logic value respectively, the outputs LO and HO of the driver itself will be at high and low logic value respectively, and so the second Power Mos transistor Q2 will be in conduction while the first Power Mos transistor Q1 will be interdicted.

Upon the variation in the value of the signal Ve, which is inversely proportional to the value of the battery voltage $V_{Batt}$, a phase control is thus achieved of the current $I_{Batt}A$ supplied by the generator G to the battery.

The second possible embodiment of the three-phase synchronous rectifier RT according to the invention, wherein the current sensor S" comprises a single magnetic linear Hall sensor (H). Such second embodiment is shown in FIGS. 7-10.

With reference to such second embodiment, the current sensor S" comprises a magnetic linear Hall sensor H connected to the toroidal element T made of a magnetic material. The linear Hall sensor H is configured to generate an output voltage $V_U$ which reproduces the pattern of the phase current $I_A$ ($I_B$, $I_C$) in the lead C with a voltage offset equal to a predefined value.

Figure 9:
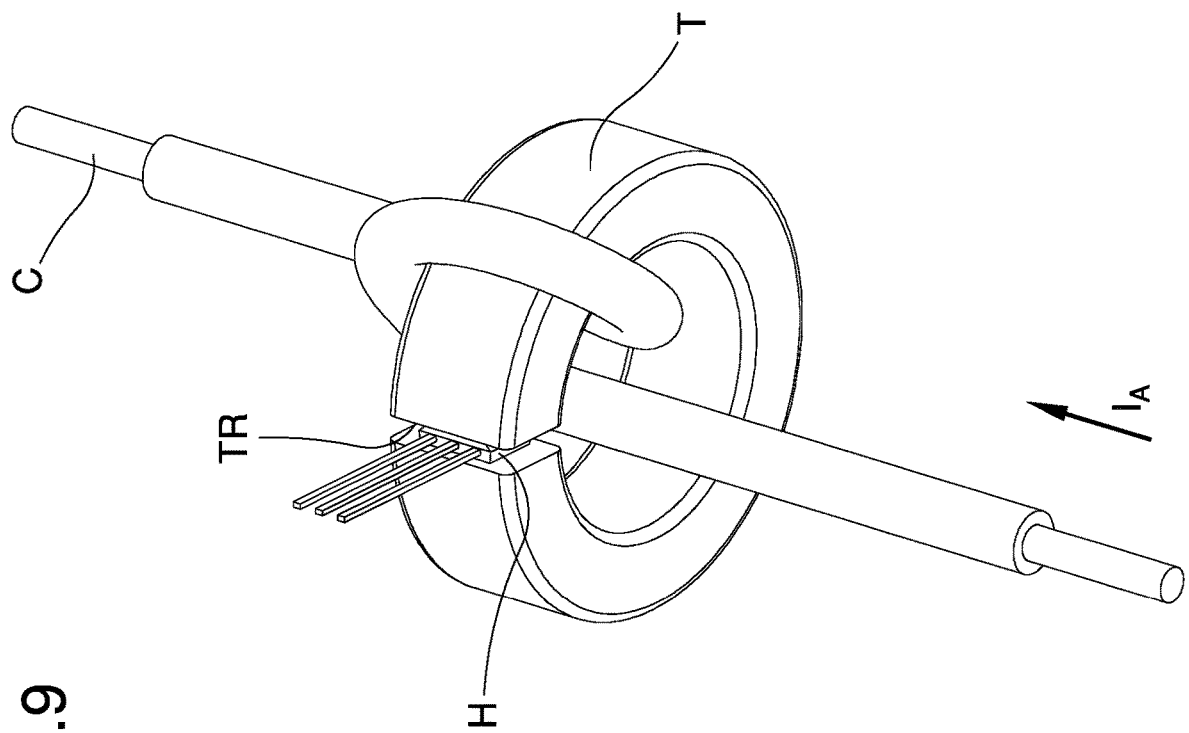
FIGS. 8 and 9 illustrate different possible implementations of a current sensor that can be used in the second embodiment of the three-phase synchronous rectifier according to the invention.
Figure 8:
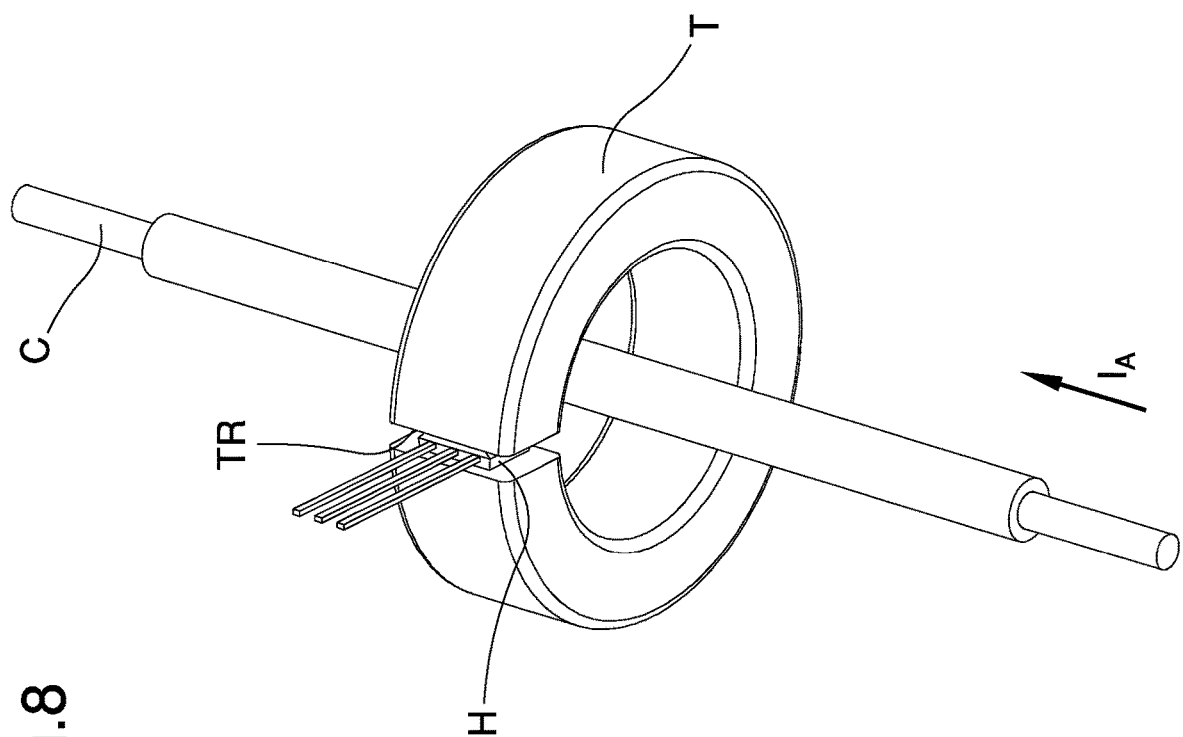

In particular, as shown in FIGS. 8 and 9, the toroidal element T is provided with an air gap TR and the linear Hall sensor H is arranged inside the air gap TR.

Figure 10:
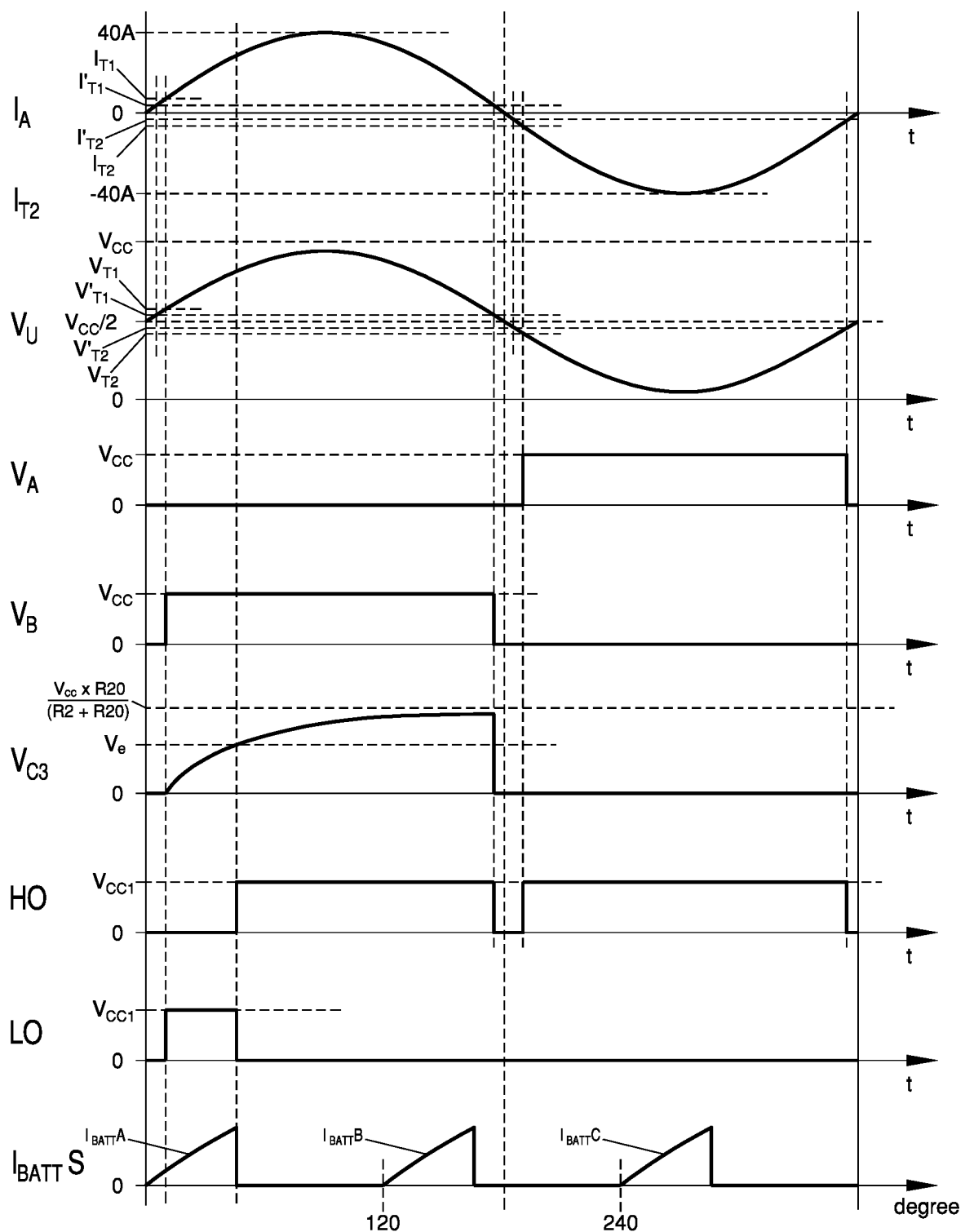
FIG. 10 graphically illustrates the patterns of the signals with reference to the second embodiment of the three-phase synchronous rectifier according to the invention.

In particular, with reference to the use of a single Hall sensor H of linear type, the output voltage $V_U$ of the sensor H reproduces the pattern of the current $I_A$ in the phase lead C with a voltage offset equal to Vcc/2. Such pattern of the voltage output $V_U$ of the Hall sensor H is shown in FIG. 10.

In this case, the current $I_A$ that passes inside the toroidal element T in ferrite induces a magnetic flow in the air gap TR proportionate to it which, in crossing the linear Hall sensor H, in turn generates an output voltage $V_U$ with a value equal to $V_{CC}/2+(K \times I_A)$, where K represents the proportionality constant between the current $I_A$ and the output voltage $V_U$.

Still with reference to the second possible embodiment of the three-phase synchronous rectifier RT, the current sensor S" comprises a first voltage comparator U1A and a second voltage comparator U1B. The linear Hall sensor H is connected to the inverting input of the first voltage comparator U1A and to the non-inverting input of the second voltage comparator U1B.

The second voltage comparator U1B is configured to:
switch its output voltage $V_B$ from a low voltage value (0V) to a high voltage value ($V_{CC}$) at a first predefined threshold value $V_{T1}$, when the phase current $I_A$ is positive and increasing;
switch its output voltage $V_B$ from a high voltage value ($V_{CC}$) to a low voltage value (0V) at a second predefined threshold value $V'_{T1}$, when the phase current $I_A$ is positive and decreasing.

The first voltage comparator U1A is configured to:
switch its output voltage $V_A$ from a low voltage value (0V) to a high voltage value ($V_{CC}$) at a first predefined threshold value $V_{T2}$, when the phase current $I_A$ is negative and decreasing;
switch its output voltage $V_A$ from a high voltage value ($V_{CC}$) to a low voltage value (0V) at a second predefined threshold value $V'_{T2}$, when the phase current $I_A$ is negative and increasing.

In particular, from the wiring diagram in FIG. 7, it can be seen that the output signal $V_U$ of the linear Hall sensor H is applied directly to the inverting input of the first voltage comparator U1A and, by means of the resistor R14, to the non-inverting input of the second voltage comparator U1B.

The first voltage comparator U1A connected as shown in FIG. 7 is configured to operate as an inverting voltage comparator with hysteresis and the trip threshold voltage values are defined by means of the resistance values selected for the resistors R7, R24 and R12.

The second voltage comparator U1B connected as shown in FIG. 7 is configured to operate as a non-inverting voltage comparator with hysteresis and the trip threshold voltage values are defined by means of the resistance values selected for the resistors R8, R25, R19 and R14.

The trip voltage thresholds of the above comparators can be set by making reference to the current threshold values $I_{T1}$, $I'_{T1}$, $I_{T2}$ and $I'_{T2}$ already mentioned in case of use of the current sensor S' with two unipolar Hall sensors H1 and H2 described above, making use of the formula shown above for the calculation of the output voltage value $V_U$.

By way of example, starting from the current threshold $I_{T1}$ the voltage threshold $V_{T1}$ is set equal to the value $V_{CC}/2+(K \times I_{T1})$.

In the same way, the other trip thresholds can be set as follows: $V'_{T1}=V_{CC}/2+(K \times I'_{T1})$; $V_{T2}=V_{CC}/2+(K \times I_{T2})$; $V'_{T2}=V_{CC}/2+(K \times I'_{T2})$.

The output signals $V_A$ and $V_B$ of the two voltage comparators U1A and U1B will behave exactly like the output signals $V_A$ and $V_B$ of the two unipolar Hall sensors H1 and H2 considered previously with reference to the first possible embodiment, leaving unchanged the operation of the downstream circuit of the voltage comparators U1A and U1B themselves.

FIG. 10 shows the patterns of the signals described above in case of operation with a current sensor S" provided with a linear Hall sensor H.

With reference to both the embodiments, from the FIGS. 6 and 10 it appears evident that the battery current $I_{BATT}S$ is given by the sum of the 3 currents $I_{BATT}A$, $I_{BATT}B$ and $I_{BATT}C$ relating to the 3 phases, identical to one another as regards value but out of phase by 120°. Having an effective balancing of the currents in the phases, we have as a consequence a "load sharing" among the phases themselves.

This feature helps to optimize the efficiency of the generator-regulator system, thus avoiding overheating of one phase compared to the others, as in the case of currents in different phases.

It has, in practice, been ascertained that the described invention achieves the intended objects.

In particular, the use of a current sensor consisting of a toroidal element made in a magnetic material, typically consisting of ferrite, crossed by the phase lead connected to the permanent magnet generator, together with the use of an air gap in the ferrite toroid inside which are placed one or two Hall sensors, makes it possible to accurately detect the zero-crossing of the current of the generator phases, while at the same time maintaining adequate response times of the synchronization system.

Furthermore, the use of the Power MOS devices which possess the conduction resistance $R_{DS(on)}$ below 1 mΩ, besides permitting low dissipation, allows a low voltage drop between the generator and the battery. In the case of a battery current of 40 A, this drop passes from about 2V in the case of a three-phase diode or SCR bridge to just a few tenths of mV depending on the conduction resistance RDS (on) of the Power Mos transistor used.

This characteristic therefore enables the generator to supply more current above all at low rotation speeds.

The invention claimed is:

1. A three-phase synchronous rectifier for a battery charger on board a vehicle, comprising:
   three rectification units provided with respective inputs connected to respective phases of a permanent magnet generator and with respective outputs being configured to be connected to a battery of the vehicle;
   wherein said three rectification units are configured to receive at input respective phase currents of said permanent magnet generator and to supply at output rectified currents,
   wherein each of said three rectification units comprises a current sensor connected to a respective phase of said permanent magnet generator and a respective output circuit configured to be connected to said battery and operatively connected to said current sensor,
   wherein said current sensor is configured to receive at said input the respective phase current and said output circuit being configured to be piloted by means of said current sensor to generate said rectified currents,
   wherein said current sensor comprises at least one toroidal element comprising a magnetic material crossed by a lead which conveys said phase current and at least one Hall effect sensor connected to said toroidal element and to said output circuit, and
   wherein said current sensor comprises at least one of:
   (i) a first digital unipolar Hall sensor and a second digital unipolar Hall sensor connected to said toroidal element that comprises a magnetic material, said first and second unipolar Hall sensors being configured to operate in a presence of respective and predefined levels of magnetic flux on said toroidal element, and
   (ii) a magnetic linear Hall sensor connected to said toroidal element that comprises said magnetic material, said magnetic linear Hall sensor being configured to generate an output voltage that reproduces a pattern of said phase current in said lead with a voltage offset equal to a predefined value.

2. The three-phase synchronous rectifier according to claim 1, wherein said toroidal element is provided with an air gap and said first and second Hall sensors are arranged inside said air gap side by side and rotated by 180 degrees the one with respect to each other.

3. The three-phase synchronous rectifier according to claim 2, wherein said first unipolar Hall sensor is configured to:
   switch its output voltage from a low voltage value to a high voltage value at a first predefined threshold value, when said phase current is positive and increasing; and
   switch its output voltage from a high voltage value to a low voltage value at a second predefined threshold value, when said phase current is positive and decreasing.

4. The three-phase synchronous rectifier according to claim 2, wherein said second unipolar Hall sensor is configured to:
   switch its output voltage from a low voltage value to a high voltage value at a first predefined threshold value, when said phase current is negative and decreasing; and
   switch its output voltage from a high voltage value to a low voltage value at a second predefined threshold value, when said phase current is negative and increasing.

5. The three-phase synchronous rectifier according to claim 1, wherein said toroidal element is provided with an air gap and said linear Hall sensor is arranged inside said air gap.

6. The three-phase synchronous rectifier according to claim 5, wherein said current sensor comprises a first voltage comparator and a second voltage comparator, said linear Hall sensor being connected to a inverting input of said first voltage comparator and to a non-inverting input of the second voltage comparator.

7. The three-phase synchronous rectifier according to claim 6, wherein said second voltage comparator is configured to:
switch its output voltage from a low voltage value to a high voltage value at a first predefined threshold value, when said phase current is positive and increasing; and
switch its output voltage from a high voltage value to a low voltage value at a second predefined threshold value, when said phase current is positive and decreasing.

8. The three-phase synchronous rectifier according to claim 6, wherein said first voltage comparator is configured to:
switch its output voltage from a low voltage value to a high voltage value at a first predefined threshold value, when said phase current is negative and decreasing; and
switch its output voltage from a high voltage value to a low voltage value at a second predefined threshold value, when said phase current is negative and increasing.

9. The three-phase synchronous rectifier according to claim 1, wherein said sensor comprises a plurality of windings of said lead around at least one portion of said toroidal element.

10. The three-phase synchronous rectifier according to claim 1, wherein said output circuit comprises at least a first transistor Power MOS and at least a second transistor Power MOS operatively connected to said current sensor and adapted to be piloted by means of said current sensor to generate said rectified currents.

11. The three-phase synchronous rectifier according to claim 10, wherein said output circuit comprises at least one half-bridge driver operatively interposed between said current sensor and said first and second transistors Power MOS.

12. The three-phase synchronous rectifier according to claim 11, wherein said half-bridge driver is provided with a first input connected to said first unipolar Hall sensor and with a second input connected to said second unipolar Hall sensor.

13. The three-phase synchronous rectifier according to claim 1, comprising a current limiting circuit configured to limit the current supplied by said permanent magnet generator to said battery in an event of the voltage supplied to the battery exceeding a predefined desired value.

14. The three-phase synchronous rectifier according to claim 13, wherein said current limiting circuit comprises an error amplifier circuit configured to measure said voltage supplied to the battery and to supply a verification voltage signal at output which varies between predefined voltage values acceptable for a correct operation of said battery.

15. The three-phase synchronous rectifier according to claim 14, wherein said error amplifier circuit comprises a measurement circuit of said voltage supplied to the battery.

* * * * *